(12) United States Patent
Finn

(10) Patent No.: US 6,910,164 B1
(45) Date of Patent: Jun. 21, 2005

(54) HIGH-RESISTANCE CONTACT DETECTION TEST MODE

(75) Inventor: Mark Finn, Mountain View, CA (US)

(73) Assignee: Cypress Semiconductor Corp., San Jose, CA (US)

(*) Notice: Subject to any disclaimer, the term of this patent is extended or adjusted under 35 U.S.C. 154(b) by 628 days.

(21) Appl. No.: 09/925,721

(22) Filed: Aug. 9, 2001

(51) Int. Cl.$^7$ ............... G01R 31/3177; G01R 31/3187
(52) U.S. Cl. .................. 714/733; 714/724; 714/734; 714/745
(58) Field of Search .................. 714/724, 733–734, 714/745

(56) References Cited

U.S. PATENT DOCUMENTS 5,610,866 A * 3/1997 McClure .................. 365/201

* cited by examiner

Primary Examiner—R. Stephen Dildine
(74) Attorney, Agent, or Firm—Kevin L. Daffer; Daffer McDaniel, LLP

(57) ABSTRACT

A method for testing a semiconductor memory device includes forcing the device into a logic state configuration that does not occur during normal operation of the device. The method may also include holding the logic state configuration for a user-variable length of time. In an embodiment, the device testing method includes flowing a direct current through a first input node of a bi-stable latch. This node may be electrically arranged between a node coupled to a voltage source and a node coupled to a circuit ground potential. An embodiment of a memory device may include testmode circuitry adapted to maintain a pair of bitlines at logic states that are not maintained during ordinary operation of the device. A system for testing a semiconductor memory device may include testmode circuitry adapted to force a pair of bitlines to the same logic state for a user-determined length of time.

25 Claims, 4 Drawing Sheets

HIGH-RESISTANCE CONTACT DETECTION TEST MODE

BACKGROUND OF THE INVENTION

1. Field of the Invention

This invention relates to semiconductor memory device testing, and more particularly to a method, system, and device for detecting high resistance contacts in semiconductor memory devices.

2. Description of the Related Art

The proliferation of computers and other microprocessor-based devices has contributed to an increasing demand for semiconductor memory. Microprocessors are present not only in computers, but in a diverse range of products including automobiles, cellular telephones and kitchen appliances. A conventional microprocessor executes a sequence of instructions and processes information. Frequently, both the instructions and the information reside in semiconductor memory. Therefore, an increased requirement for memory has accompanied the microprocessor boom.

There are various types of semiconductor memory, including Read Only Memory (ROM) and Random Access Memory (RAM). ROM is typically used where instructions or data must not be modified, while RAM is used to store instructions or data which must not only be read, but modified. ROM is a form of non-volatile storage—i.e., the information stored in ROM persists even after power is removed from the memory. On the other hand, RAM storage is generally volatile, and must remain powered-up in order to preserve its contents.

A conventional semiconductor memory device stores information digitally, in the form of bits (i.e., binary digits). The memory is typically organized as a matrix of memory cells, each of which is capable of storing one bit. The cells of the memory matrix are accessed through the use of column select lines and row select lines. Raising a column select line activates a given column; raising a row select line activates a given row. The bitlines are then used to read from or write to the corresponding cell in the currently active row and column. Memory cells are typically capable of assuming one of two logic states (commonly described as "on" or "off"). Information is stored in the memory by setting each cell in the appropriate logic state. For example, to store a bit having the value "1" in a particular cell, one would set the state of that cell to "on"; similarly, a "0" would be stored by setting the cell to the, "off" state. (The association of "on" with "1" and "off" with "0" is arbitrary, and could be reversed.) Setting a cell to a particular state may require applying a voltage within a corresponding voltage range. For example, "off" may be associated with voltages near circuit ground ("Vss"), while "on" may be associated with voltages near circuit power ("Vcc").

The two major types of semiconductor RAM, Static Random Access Memory (SRAM) and Dynamic Random Access Memory (DRAM), differ in the manner by which their cells represent the state of a bit. In an SRAM, each memory cell includes transistor-based circuitry that implements a bi-stable latch. A bi-stable latch relies on transistor gain and positive (i.e. reinforcing) feedback to guarantee that it can only assume one of two states—"on" or "off." The latch is stable in either state (hence, the term "bi-stable"). It can be induced to change from one state, or voltage range, to the other only through the application of an external stimulus; left undisturbed, it will remain in its original state indefinitely. This is just the sort of operation required for a memory circuit, since once a bit value has been written to the memory cell, it will be retained until it is deliberately changed.

In contrast to the SRAM, the memory cells of a DRAM employ a capacitor to store the "on"/"off" logic state (or voltage state) representing the bit. A transistor-based buffer drives the capacitor. The buffer quickly charges or discharges the capacitor to change the state of the memory cell, and is then disconnected. Ideally, the capacitor then holds the charge placed on it by the buffer and retains the stored voltage level. DRAMs have at least two drawbacks compared to SRAMs. The first of these is that leakage currents within the semiconductor memory are unavoidable, and act to limit the length of time the memory cell capacitors can hold their charge. Consequently, DRAMs typically require a periodic refresh cycle to restore sagging capacitor voltage levels. Otherwise, the capacitive memory cells would not maintain their contents. Secondly, changing the state of a DRAM memory cell requires charging or discharging the cell capacitor. The time required to do this depends on the amount of current the transistor-based buffer can source or sink, but generally cannot be done as quickly as a bi-stable latch can change state. Therefore, DRAMs are typically slower than SRAMs. DRAMs offset these disadvantages by offering higher memory cell densities, since the capacitive memory cells are intrinsically smaller than the transistor-based cells of an SRAM.

SRAMs are widely used in applications where speed is of primary importance, such as cache memory supporting the Central Processing Unit (CPU) in a personal computer. Like most semiconductor devices, SRAMs are fabricated en masse on semiconductor wafers, and subsequently sectioned and packaged. In the production process, a wafer sort test is performed. During this step, the individual SRAMs are electrically tested before sectioning the wafer. Any bad SRAMs identified at this stage are discarded when the wafer is sectioned, thus avoiding the cost of packaging.

The wafer sort succeeds in detecting many hard failures, such as shorted address lines. However, there are more subtle defects that can go undetected until the packaged SRAM is subjected to burn-in. Burn-in can include repeatedly writing (and optionally reading) the entire SRAM cell by cell. To further simulate prolonged usage of the device, burn-in may be performed under conditions of increased temperature and/or voltage. High-resistance contacts are among the more subtle defects that may be detected following burn-in. High-resistance contacts are often insufficient to cause the SRAM to fail preliminary functional testing during wafer sort, but tend to worsen after many hours of burn-in. Eventually, the resistance of the contact may be great enough to cause the device to fail when tested after burn-in. Still, some of the devices may pass burn-in yet subsequently fail after actual usage. Clearly, it is extremely undesirable to provide customers with devices that fail prematurely.

It would therefore be desirable to have a means of detecting devices prone to this failure mode before the packaged devices are shipped to customers. It would also be desirable to have a means of detecting these devices before going to the expense and trouble of packaging the devices. Further, it would be desirable to detect these devices before going to the expense of burn-in. Manufacturing costs are reduced and yields are improved the earlier faulty devices are screened.

SUMMARY OF THE INVENTION

The problems outlined above may be addressed by an improved method of integrated circuit testing disclosed herein. Testing as used herein may include stress testing, or "stressing," of an integrated circuit. Stressing may include subjecting the integrated circuit to extremes in operating conditions. The improved method may be particularly applicable to a semiconductor memory device, but it is believed that principles disclosed herein are applicable to other types of integrated circuits as well.

In an embodiment, a method for testing an integrated circuit disclosed herein includes forcing a device into a logic state configuration not occurring during normal operation. The method may include holding the logic state configuration for a predetermined time, and this time may be user-variable. Circuitry external to the device may be used to either force or hold the device into the logic state configuration. In an embodiment, the logic state configuration may include maintaining each of a pair of normally complementary bitlines at the same logic state. For example, the bitlines may both be held at circuit ground. In an embodiment, the method may also include flowing a direct current through a memory device from a voltage source to each of a pair of bitlines. Flowing a direct current through the device may include flowing the current through at least one local interconnect structure of a bi-stable latch.

According to one embodiment, a method of testing a semiconductor memory device includes flowing a direct current through a first input node of a bi-stable latch. The first input node of a bi-stable latch may be arranged electrically between a first node electrically coupled to a ground potential and a second node electrically coupled to a voltage source. The method may also include flowing a second direct current through a second input node of the bi-stable latch. In this case, the second input node of the bi-stable latch may be arranged between a third node electrically coupled to a ground potential and a fourth node electrically coupled to a voltage source. In an embodiment, the memory device may be an SRAM, and the direct current may be passed through the memory device following packaging of the device.

An embodiment of a memory device including testmode circuitry is disclosed herein. The testmode circuitry is adapted to force to the same logic state a pair of ordinarily complementary bitlines. For example, the testmode circuitry may be adapted to force the pair of bitlines to circuit ground or Vss. It is noted that the pair of bitlines may be at the same logic state without having precisely the same current or the same voltage. In contrast, both bitlines are said to be at the same logic state if both bitlines are within their respective voltage ranges for either "0" or "1." In an embodiment, the testmode circuitry may be adapted to force the bitlines to the same logic state for a user-determined length of time. Operation of the testmode circuitry may also include a direct current from a voltage source to each of the pair of bitlines, and this path may include a corresponding local interconnect structure. Each local interconnect structure may include at least one contact through which direct current passes. The voltage from the voltage source and/or the time of the current flow may each be user-determined.

Also disclosed herein is a semiconductor memory device testing system that includes testmode circuitry. The testmode circuitry is adapted to force to the same logic state a pair of bitlines that are not held at that logic state simultaneously during normal operation of the device. In an embodiment, the bitlines may both be forced to a ground potential. The bitlines may also maintain the same logic state for a user-determined length of time. The testmode circuitry may be within the memory device. Additionally, the system may be adapted to test a packaged memory device.

BRIEF DESCRIPTION OF THE DRAWINGS

Other objects and advantages of the invention will become apparent upon reading the following detailed description and upon reference to the accompanying drawings in which.

Figure 1:
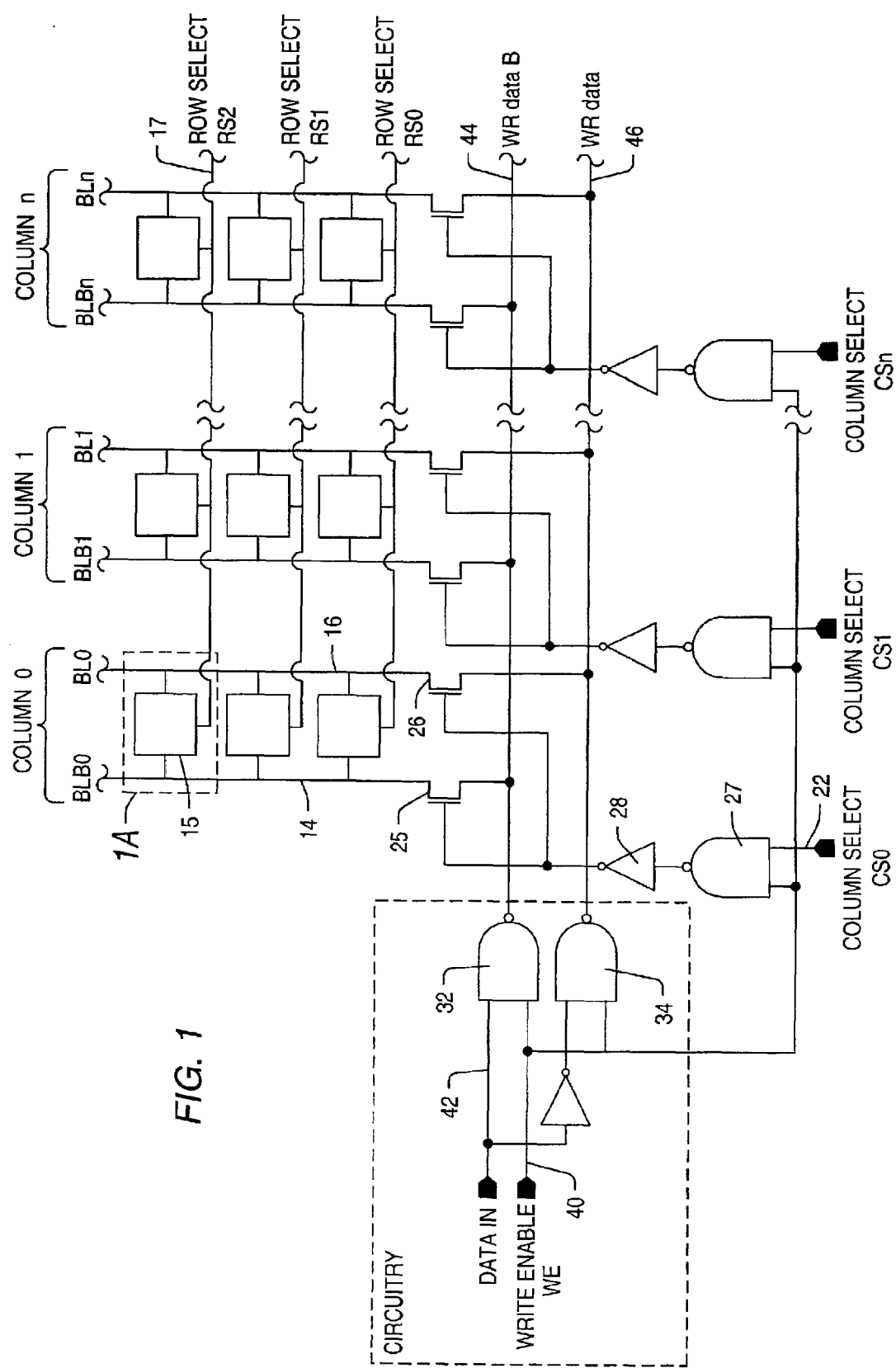
FIG. 1 shows the organization of an SRAM memory device and associated circuitry.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

The improved system and method of testing an integrated circuit and the improved circuit design including testmode circuitry disclosed herein may provide numerous advantages. This circuit design may be improved because it incorporates testmode circuitry that allows combinations of logic states that are not possible under normal operating conditions. These combinations of logic states may allow systems and methods of circuit testing that were not previously possible. As an example, stress testing of circuit nodes that normally see only transient currents may be possible as a result of the improved circuit design. That is, it may be possible to maintain direct currents through circuit nodes that normally see only transient currents during ordinary operation of an integrated circuit. In an embodiment, it may be possible to maintain direct current though these nodes for a user-determined period. Thus, it may be possible to stress these circuit nodes to determine their functionality and reliability. As a consequence, it may be possible to identify faulty integrated circuits more quickly and more easily. An additional advantage is that the improvements disclosed herein may allow testing of the integrated circuit in a more quantitative fashion. As an example, the voltages, currents, and times used by the methods and systems of integrated circuit testing disclosed herein may all be user selectable. As such, relevant information regarding failure thresholds may be provided which may facilitate the identification and resolution of failure mechanisms. Therefore, the improvements disclosed herein may advantageously allow the identification of faulty integrated circuits much sooner in the manufacturing process, thus reducing manufacturing costs and increasing line yields.

As noted above, SRAMs are a widely used type of semiconductor memory device. These memories are commonly employed where fast memory access is necessary (such as in network applications and computer caches) or in embedded applications, where the complexity of a DRAM memory interface is unwarranted. The organization of an SRAM memory device is shown in FIG. 1. An SRAM memory device as shown may ultimately form an independent, distinct packaged semiconductor device. However, an SRAM memory device including one or more memory cells may also be incorporated into another type of independent, distinct packaged device such as a processor or some other type of logic device.

Figure 1A:
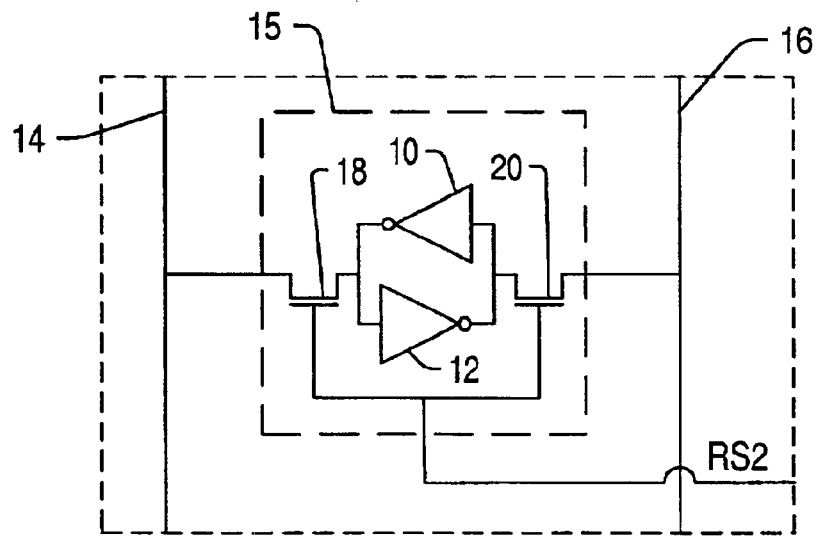
FIG. 1A shows the organization of the memory cell 1A indicated in FIG. 1.

In FIG. 1, memory cell 15 is indicated as 1A. Therefore, in FIG. 1A, memory cell 15 is shown in more detail, illustrating pass transistors 18 and 20, and cross-coupled inverters 10 and 12 which form a bi-stable latch. (Note that these inverters are actually fabricated from discrete transistors. However, the schematic representation used in FIG. 1A is more suggestive of their operation.) It will be seen that the output of each inverter provides positive feedback to the input of the other. For example, if the input of inverter 10 goes High, its output goes Low. This drives the input of inverter 12 Low, reinforcing the High at the input of inverter 10. As a result, the latch is capable of retaining a logic state, enabling it to serve as a storage element.

As shown in FIG. 1, the logic state of each latch may be brought out to a pair of complementary bit lines, BL and BLB. Typically, complementary lines are so related during operation of the circuit that the logic state of each is the negation of the other. That is, if one complementary line of an accessed memory cell carries logic High, the other will carry logic Low. The bitline carrying logic High will thus carry a voltage within the range defined as logic High, likewise the bitline carrying logic Low will carry a voltage within the range defined as logic Low. Logic Low may also be referred to as circuit ground. Bit lines BLB0 14 and BL0 16 are shown in FIG. 1. Note that the leftmost pair of bitlines is numbered "0," and the bitline pair numbers increment by one from left to right. The column select lines follow the same convention. Similarly, the lowermost row select line RS is numbered "0," and the row select line numbers increment by one from bottom to top. Pass transistors 18 and 20 of FIG. 1A control access to bit lines 14 and 16, respectively. These pass transistors are turned on when row select (RS2) 17 is High. Column select CS0 22 and WE 40 are inputs to NAND gate 27, which provides the input for inverter 28. The output of inverter 28 gates column select transistors 25 and 26. Consequently, column select and associated circuitry are configured such that each column of memory cells may be accessed independently of the other columns. Similarly, row select is configured such that each row of cells may be accessed independently of the other rows.

During write operations, WE 40 and CS0 22 go High, allowing transistor 25 to connect the output of NAND gate 32 to BLB0 14. Similarly, transistor 26 connects the output of NAND gate 34 to BL0 16. The NAND gates buffer the logic state on data-in line 42 and store this state in the bi-stable latch by overriding the inverters 10 and 12. Assume, for example, the output of inverter 10 of FIG. 1A is High, WE 40 is High, CS0 22 is High, RS2 17 is High, and data-in line 42 is Low. NAND gates 32 and 34, connected through column select transistors 25 and 26, respectively, will place logic High and Low on bitlines BLB0 14 and BL0 16, respectively. Row select 17 will turn on pass transistors 18 and 20 of FIG. 1A. This allows bitlines BLB0 14 and BL0 16 to overcome inverters 10 and 12, respectively, and pull them High and Low, respectively, thus changing the state of the latch. Once this has been accomplished, pass transistors 18 and 20 may be turned off, and the latch retains the new state by virtue of positive feedback, as described above.

During read operations, WE 40 is Low. This disables transistors 25 and 26. In order to read the cell, the voltage difference between the two complementary bit lines 14 and 16 may be buffered to appear as either a 1 or a 0 at a data output. Buffering may be performed by, for example, a differential sense amplifier, not shown.

Like most semiconductor devices, SRAMs are mass-produced, with multiple memory devices being created on a single silicon wafer. The wafer is subsequently sectioned to separate the SRAMs, and the individual devices are placed in packages with attached leads. Prior to sectioning the wafer, a gross functional test is one of the tests performed on the memory devices to identify non-functional SRAMs prior to packaging. This functional testing may evaluate one bit of the device at a time. The testing performed prior to packaging may be referred to as "wafer sort." Although wafer sort is an effective means of removing devices with "hard" failures, it may not detect a variety of pre-failure conditions that may exist. That is, wafer sort may not identify a variety of sub-optimal device features or characteristics that result in a subsequent failure. Such sub-optimal device features or characteristics are referred to herein as pre-failure conditions. Pre-failure conditions may result in faulty packaged devices. Some faulty devices will subsequently fail reliability testing. Reliability testing may include stress testing and/or burn-in testing. Following reliability testing, functional testing may again be performed to identify failed cells and thus failed devices.

Stress testing may attempt to subject a device to extremes in operating conditions, thus "stressing" the device. Such operating extremes that may be used during a stress test may include voltage and/or current that is outside the normal operating ranges. Burn-in testing may attempt to simulate many hours of operation in a much shorter period of time by, for example, operating the device in extreme environmental conditions. For example, extreme conditions may include any combination of increased temperature, temperature cycling, increased voltage, voltage cycling, and increased humidity. Burn-in testing may also include toggling the bi-stable latch of the memory cells of an SRAM repeatedly. Although burn-in testing may include writing alternate logic states into the device, burn-in testing may or may not perform read operations. That is, the burn-in may be a "dumb burn-in," a burn-in where the read commands are given but the contents of the SRAM are not actually read. Alternately, the burn-in may be a "monitored burn-in," one that writes to and reads from the SRAM repeatedly. "Monitored burn-in" may be performed at a high temperature. Further, "monitored burn-in" may continue while dropping the temperature to an operating temperature and performing functional testing while the part is still configured for burn-in testing. That is, while the part is still on the burn-in board and in the oven. Finally, the "monitored burn-in" may then raise the temperature from the operating temperature and continue burn-in cycles. During reliability testing, the operation of defective or weak devices may be accelerated to the point of failure. However, some pre-failure conditions may not be detected even after reliability testing.

One such pre-failure condition is believed to be high resistance contacts. The contact resistances may initially be small, but when the SRAM is operated for extended periods at elevated temperatures or voltages (as may be done during reliability testing), the resistances can increase to the point where the SRAM may no longer pass functional tests.

Present wafer sort test methods may not detect all high resistance contacts. As a result, potentially faulty devices may be passed through to subsequent stages of production, only to eventually fail. This adversely affects device yields and production costs. Worse, some devices may pass burn-in yet fail prematurely when put into use by the customer.

A system, method, and device are disclosed herein for detecting high resistance contacts in semiconductor devices during either functional testing or reliability testing. This system, method, and device are believed to provide means for improving quality and yield by eliminating faulty devices in earlier stages of production.

Figure 2:
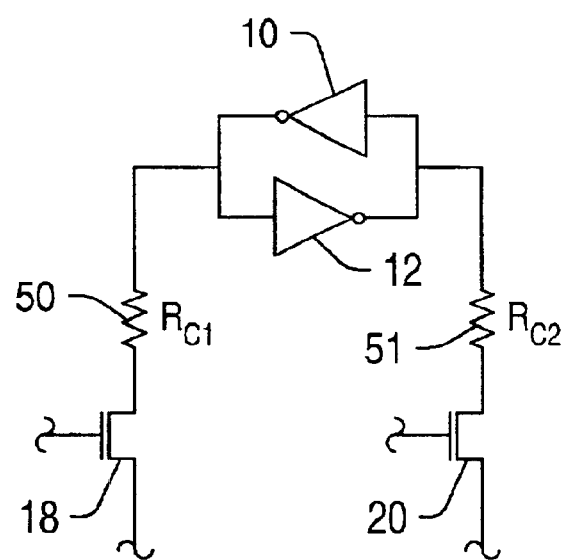
FIG. 2 represents high resistance contacts in an SRAM memory cell.

FIG. 2 illustrates the presence of potentially high resistance contacts in SRAM memory cell 15. (Elements appearing in more than one figure retain the same item numbers throughout the figures.) Note that in addition to the components included in memory cell 15 (i.e., inverters 10 and 12, and pass transistors 18 and 20), resistances $R_{C1}$ 50 and $R_{C2}$ 51 are shown. $R_{C1}$ 50 is located between the output of inverter 10 and the drain of pass transistor 18 and $R_{C2}$ 51 is located between the output of inverter 12 and the drain of pass transistor 20. It is noted that the input of inverter 10 is the output of inverter 12 and vice versa. Possible sources of resistances $R_{C1}$ 50 and $R_{C2}$ 51 are discussed below.

Figure 3:
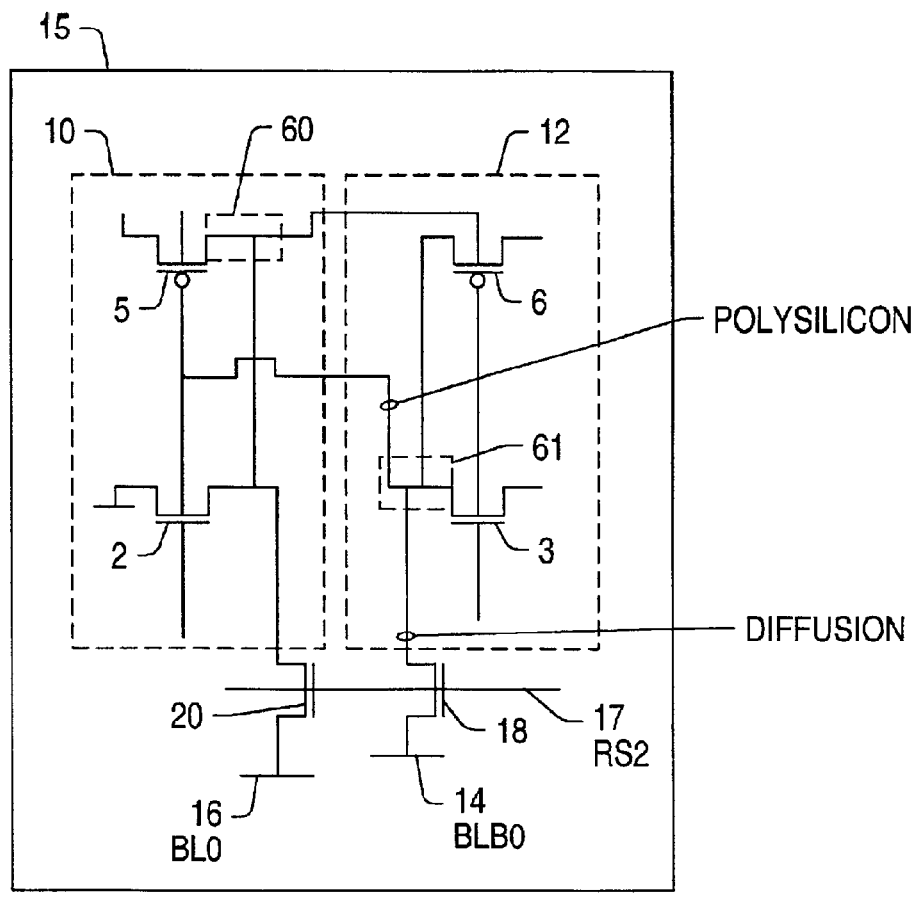
FIG. 3 represents an SRAM memory cell as discrete transistors.
Figure 3A:
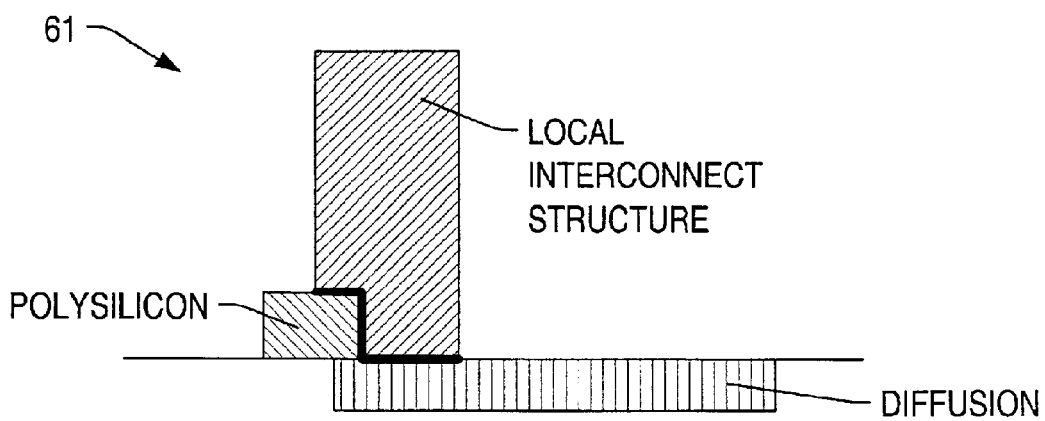
FIG. 3A shows a local interconnect structure contacting a polysilicon structure and a diffusion region.

As noted above, inverters 10 and 12 are typically fabricated from discrete transistors. Referring to FIG. 3, an embodiment of a transistor implementation of memory cell 15, including inverters 10 and 12, is shown. In this embodiment, inverter 10 includes n-type transistor 2 and p-type transistor 5. Inverter 12 includes n-type transistor 3 and p-type transistor 6. Resistances $R_{C1}$ 50 and $R_{C2}$ 51, as shown in FIG. 2, are located between inverter inputs/outputs and pass transistors. However, they are not specifically shown in FIG. 3 because the precise location of the resistance may be unknown. Local interconnect structures 60 and 61 are shown as outlines to emphasize that they may contact multiple structures and regions. Resistances $R_{C1}$ 50 and $R_{C2}$ 51 may be located in or near local interconnect structures 60 and 61, respectively. For example, resistance may be caused by the interface between a local interconnect conductor and a local interconnect plug, or by the interface between a local interconnect plug and an underlying material. Or, as shown in FIG. 3A, a local interconnect structure may contact both a polysilicon structure and a diffusion region, such that a high resistance contact may exist between the local interconnect structure and any combination of contacted materials, structures, or regions. A local interconnect structure may include, for example, any combination of local interconnect plugs, local interconnect conductors, or trenched local interconnects.

Resistances $R_{C1}$ 50 and $R_{C2}$ 51 may result from defects in the SRAM that may escape detection during wafer sort. If the defect is associated with a local interconnect structure, it could be in the form of, for example, a particle between a local interconnect contact and a diffusion region. Other possibilities include voids within a local interconnect plug, a particle between a local interconnect contact and a polysilicon structure, or poor adhesion associated with the local interconnect plug. These, and other, types of contact resistance may not initially be high enough to impair operation of the memory cell. However, resistance often increases with prolonged operation at high temperatures or voltages, and may ultimately impede current flow, resulting in failure of the SRAM.

It is noted that resistances $R_{C1}$ 50 and $R_{C2}$ 51 are not necessarily restricted to either high resistance contacts or defects associated with local interconnect structures. Other types of pre-failure conditions may be stressed by the methods and systems recited herein. These pre-failure conditions may be attributed to any number of anomalies that may exist anywhere on or within a current path through an integrated circuit, in this case through an input/output node of a bi-stable latch. These anomalies may be formed during the processing, or fabrication, of the integrated circuit. Further, pre-failure conditions may also be attributed to a limitation of the design of the integrated circuit. Pre-failure conditions attributed to design limitations may or may not exist in the presence of any type of processing anomaly. Consequently, the methods and systems recited herein may be applicable to stressing other types of pre-failure conditions.

During normal operations and normal testing of an SRAM memory cell such as that illustrated by FIG. 3, the input/output nodes of the inverters see only a brief current each time the state of the inverter changes. For example, these nodes see a current at the point in the cycle when the inverter changes state. The current does not flow for an entire cycle. Consequently, these nodes see only a transient current under normal operations and normal testing conditions. The current path through these nodes is not stressed during normal testing. Thus, some pre-failure conditions may not cause failure during testing. The current path through these nodes is not stressed because the bitlines BLB0 14 and BL0 16 are forced to carry inverse logic states by the circuitry commonly used during the operation or testing of the SRAM. For example, FIG. 1 illustrates an embodiment of such circuitry labeled "CIRCUITRY." NAND gates 32 and 34 force their outputs, WRdataB 44 and WRdata 46, respectively, to carry inverse logic states when write enable line WE 40 is High. These logic conditions, or combinations of logic states, are shown by the following truth table, "Table 1: Logic Conditions during Normal Operations." A node may be referred to as having a particular logic state, whereas an entire circuit may be referred to as having a logic condition. Typically, logic states and logic conditions are maintained for at least one cycle.

TABLE 1

Logic Conditions during Normal Operations

| Write Enable | Data In | WRdataB | Wrdata |
|---|---|---|---|
| 1 | 0 | 1 | 0 |
| 1 | 1 | 0 | 1 |

Consequently, the testing of an SRAM may place bitlines BLB0 14 and BL0 16 at complementary logic states when write enable line WE 40 is High and pass transistors 18 and 20 are on. Therefore, the inputs/outputs of the inverters will either see no current because there will be no logic state transition of the bitlines, or they will see only a transient current because the current will cease once the transition occurs. Consequently, the input/output nodes are not stressed because they do not carry currents for any appreciable length of time.

In an embodiment, it would be desirable to force the nodes of an integrated circuit to carry a direct current for a user-determined period, thus stressing the nodes. One method of accomplishing this may be to implement alternate testing circuitry. In an embodiment, the test circuitry shown in FIG. 1 and labeled "CIRCUITRY" may be replaced with the test circuitry of FIG. 4. NAND gates 54 and 56, shown in FIG. 4, force their outputs, WRdataB 44 and WRdata 46, respectively, to carry Low logic states when write enable line WE 40 is High and test mode B (TMB) line 48 is Low as shown by the following truth table, "Table 2: Logic Conditions during Testing Operations."

TABLE 2

Logic Conditions during Testing Operations

| Write Enable | Data In | Test mode B | WRdataB | Wrdata |
|---|---|---|---|---|
| 1 | 0 | 0 | 0 | 0 |
| 1 | 1 | 0 | 0 | 0 |

Figure 4:
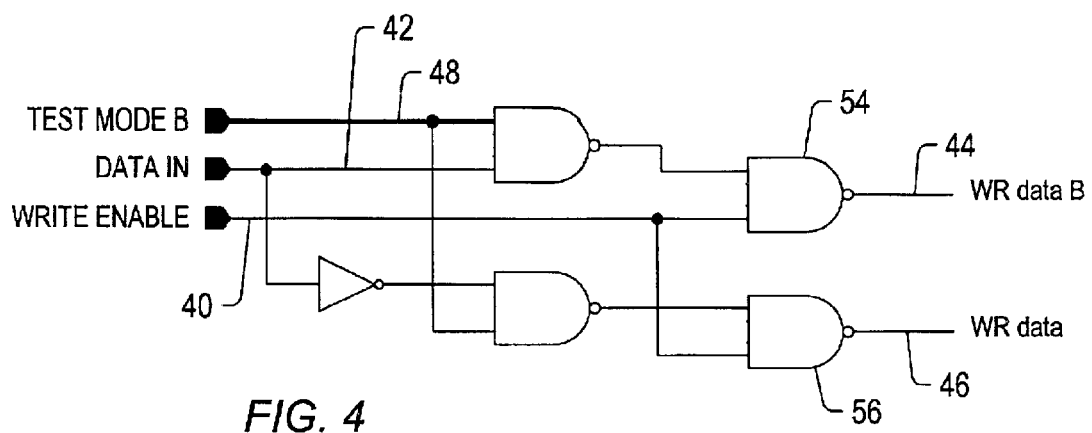
FIG. 4 illustrates test circuitry.

Consequently, if the test circuitry shown in FIG. 4 is incorporated into the testing (stressing) of an integrated circuit, WRdataB 44 and WRdata 46 may be held Low together for as long as WE 40 is High and TMB 48 is Low. Therefore, the length of time WRdataB 44 and WRdata 46 are Low is user selectable and user variable. Consequently, when the test circuitry shown in FIG. 4 replaces that in FIG. 1, bitlines BLB0 14 and BLB 16 may also be held Low simultaneously for a user variable length of time. That is, when WE 40 is High, TMB 48 is Low, and column select 22 is High, BLB0 14 and BL0 16 of FIG. 1 are both at logic Low. As such, BLB0 14 and BL0 16 may be held at circuit ground potential. Holding both bitlines at logic Low simultaneously will stress the memory cell as described below.

Assume that RS 17 as shown in FIG. 3 is High, and BLB0 14 and BL0 16 are both at circuit ground potential. Consequently, n-type pass transistors 18 and 20 will be on since RS 17 gates them. Therefore, a logic Low will be presented from pass transistors 18 and 20 to the gates of p-type transistors 6 and 5, respectively, turning them both on. Further, pass transistors 18 and 20 also gate n-type transistors 3 and 2, respectively, turning them off. Therefore, transistors 5, 6, 18, and 20 are on, the sources of transistors 5 and 6 are coupled to a voltage source, and the bitlines are coupled to circuit ground. As a result, direct current flows from the voltage source through transistors 5, 6, 18, and 20 to ground. Consequently, each of the large nodes that form the inputs/outputs of the SRAM's bi-stable latch carries direct current. The direct current may vary according to the voltage presented at the voltage source. Accordingly, a user-definable current may stress all circuit elements between the voltage source and the bit lines for a user-definable length of time. In an embodiment, two of the latch transistors may be replaced with resistors to ground. For example, n-type transistors 2 and 3 may be replaced with resistors to ground.

As noted above, in testing an SRAM a functional test may be performed to identify operable bits. Following the functional test a reliability test in the form of either a burn-in test or a stress test may be performed. A stress test may be performed on an SRAM such as that shown in FIG. 1 either row-by-row or column-by-column. However, a stress test may also test one bit at a time. In an embodiment, the stress test may include inducing a direct current through the SRAM as described above. During burn-in stressing, an entire SRAM is subjected to environmental conditions. However, the individual bits may be stressed as described above. Following the stress test, the functional test may be repeated to determine if any bits which were previously operable are no longer operable. Either the functional test or the stress test may be implemented with test circuitry. The test circuitry may be located on the semiconductor chip itself, or it may be located within external testing equipment.

Figure 5:
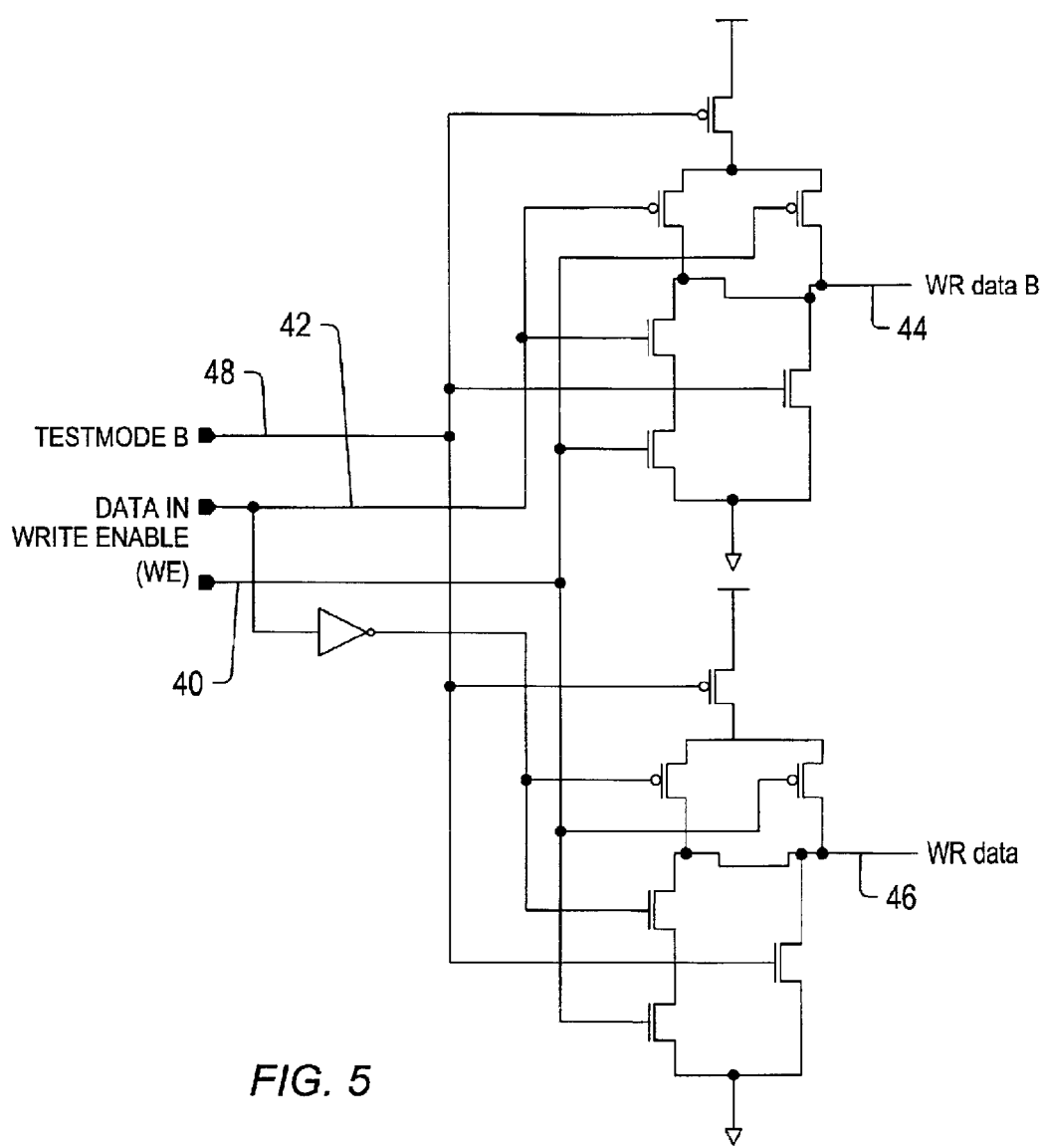
FIG. 5 illustrates discrete transistors included in the test circuitry of FIG. 4.

In an embodiment, the test circuitry may be incorporated into the semiconductor chip itself. Illustrated in FIG. 5 is the test circuitry of FIG. 4 with NAND gates 54 and 56 shown in a discrete transistor implementation as might be incorporated into the on-chip circuitry of an integrated circuit.

It will be appreciated to those skilled in the art having the benefit of this disclosure that the embodiments described are believed applicable to semiconductor memories. Furthermore, although illustrated with reference to SRAMs, the system, method, and circuit design disclosed herein may be adapted to other types of memory devices or further to other semiconductor devices that contain nodes that experience only transient currents during ordinary operation. Accordingly, the specification and drawings are to be regarded in an illustrative rather than a restrictive sense as to possibly numerous architectures, circuitry, and methodologies which fall within the spirit and scope of the present invention.

What is claimed is:

1. A semiconductor memory device comprising testmode circuitry, adapted to maintain a pair of bitlines coupled to a memory cell within the device to the same logic state during operation of the testmode circuitry by forwarding a direct current from a voltage source to each of the pair of bitlines through a path that comprises a respective local interconnect structure, wherein the bitlines are not maintained at the logic state during ordinary operation of the device.

2. The semiconductor memory device as recited in claim 1, further comprising a user-determined voltage from the voltage source.

3. The semiconductor memory device as recited in claim 1, wherein the direct currents flow for a user-determined time.

4. The semiconductor memory device as recited in claim 1, wherein each of the local interconnect structures comprises at least one contact through which the respective direct current passes when the bitlines are at the same logic state.

5. The semiconductor memory device as recited in claim 1, wherein the testmode circuitry is further adapted to force the pair of bitlines to circuit ground.

6. The semiconductor memory device as recited in claim 1, wherein the testmode circuitry is further adapted to hold the bitlines at the same logic state for a user-determined length of time.

7. A system for testing a semiconductor memory device, said system comprising testmode circuitry within the semiconductor memory device adapted to maintain a pair of bitlines coupled to a memory cell within the memory device to the same logic state, wherein the bitlines are not maintained at the logic state during ordinary operation of the device.

8. Tho system as recited in claim 7, wherein the testmode circuitry is adapted to force the pair of bitlines to a circuit ground potential.

9. The system as recited in claim 7, wherein the testmode circuitry is further adapted to maintain the pair of bitlines at the same logic state for a user-determined length of time.

10. The system as recited in claim 7, wherein the system is adapted to test a packaged memory device.

11. A method for testing a semiconductor memory device, said method comprising forcing the memory device into a logic state configuration not occurring during normal operation of the device by holding each of the bitlines at a circuit ground potential.

12. The method as recited in claim 11, wherein said forcing comprises maintaining each of a pair of bitlines within the device at the same logic state, wherein the bitlines are complementary during normal operation of the device.

13. The method as recited in claim 11, wherein said forcing comprises using circuitry external to the memory device.

14. The method as recited in claim 12, wherein said forcing comprises flowing a direct current through the memory device from a voltage source to each of the pair of bitlines.

15. the method as recited in claim 14, wherein flowing a direct current through the memory device comprises flowing a direct current through at least one local interconnect structure of a bi-stable latch.

16. The method as recited in claim 11, wherein said forcing comprises holding the logic state configuration not occurring during normal operation of the device for a predetermined time.

17. The method as recited in claim 16, wherein said predetermined time is user-variable.

18. The method as recited in claim 11, said method further comprising performing a gross functional test on the memory device prior to said forcing.

19. The method as recited in claim 11, said method further comprising performing a gross functional test on the memory device after said forcing.

20. A method of stressing a semiconductor memory device comprising passing a first direct current through a first input node of a bi-stable latch within the memory device.

21. The method as recited in claim 20, wherein said passing the first direct current through the first input node comprises electrically coupling a first node within the memory device to a circuit ground potential and electrically coupling a second node within the memory device to a voltage source, wherein the first input node is arranged electrically between the first and second nodes.

22. The method as recited in claim 20, said method further comprising passing a second direct current through a second input node of a bi-stable latch within the memory device.

23. The method as recited in claim 22, wherein said passing the second direct current through the second input node comprises electrically coupling a third node within the memory device to a circuit ground potential and electrically coupling a fourth node within the memory device to a voltage source, wherein the second input node is arranged electrically between the third and fourth nodes.

24. The method as recited in claim 20, wherein the memory device comprises an SRAM.

25. The method as recited in claim 20, wherein said passing the direct current through the memory device occurs after packaging the device.

* * * * *